United States Patent
Shin et al.

(10) Patent No.: US 6,218,079 B1
(45) Date of Patent: Apr. 17, 2001

(54) METHOD FOR METALIZATION BY DUAL DAMASCENE PROCESS USING PHOTOSENSITIVE POLYMER

(75) Inventors: Hong-jae Shin, Seoul; Byeong-jun Kim, Suwon, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/350,806

(22) Filed: Jul. 9, 1999

(30) Foreign Application Priority Data

Jul. 9, 1998 (KR) .................................................. 98-27664

(51) Int. Cl.[7] ...................................................... G03F 7/26
(52) U.S. Cl. .......................... 430/314; 430/394; 430/396
(58) Field of Search ...................................... 430/314, 316, 430/394, 396

(56) References Cited

U.S. PATENT DOCUMENTS

| 5,935,762 | * | 8/1999 | Dai et al. | 430/312 |
|---|---|---|---|---|
| 5,985,753 | * | 11/1999 | Yu et al. | 438/637 |
| 6,025,259 | * | 2/2000 | Yu et al. | 438/618 |
| 6,037,664 | * | 3/2000 | Zhao et al. | 257/758 |
| 6,042,999 | * | 3/2000 | Lin et al. | 430/316 |
| 6,103,616 | * | 8/2000 | Yu et al. | 438/622 |

* cited by examiner

Primary Examiner—Janet Baxter
Assistant Examiner—Barbara Gilmore
(74) Attorney, Agent, or Firm—Marger Johnson & McCollom, P.C.

(57) ABSTRACT

A method of forming a metal wiring using a dual damascene process is provided. A photosensitive polymer having low permittivity is used as an etch mask. Though the etch mask remains in the final structure, its low permittivity reduces parasitic capacitance effects. In this method, a photosensitive polymer pattern having a first hole with a first width is formed on a first interlayer dielectric film. A second interlayer dielectric film is formed on the photosensitive polymer pattern. A mask pattern, having a second hole, above the first hole, with a second width larger than the first width, is formed on the second interlayer dielectric film. A wiring region is formed by dry-etching the second interlayer dielectric film using the mask pattern as an etch mask. A via hole region is formed by dry-etching the first interlayer dielectric film using the photosensitive polymer pattern as an etch mask.

12 Claims, 7 Drawing Sheets

METHOD FOR METALIZATION BY DUAL DAMASCENE PROCESS USING PHOTOSENSITIVE POLYMER

BACKGROUND OF THE INVENTION

1. Field of the Invention

The present invention relates to a method of fabricating a semiconductor device, and more particularly, to a method of forming a metal wiring using a dual damascene process.

2. Description of the Related Art

With an increase in the integration of semiconductor devices, a multi-layered metal wiring structure is required, and the spacing between metal wirings has decreased. Thus, the parasitic resistance (R) effect and the parasitic capacitance (C) effects existing between adjacent conductors on a layer and between vertically adjacent wiring layers are potentially greater for highly-integrated semiconductor devices. Such parasitic resistance and capacitance degrade the electrical performance of the device due to a delay induced by RC. Also, the parasitic resistance and capacitance components increase the overall chip power dissipation and the amount of signal cross talk. Therefore, in ultra highly-integrated semiconductor devices, it is important to develop a technology of multi-layered wiring having a small RC.

In order to form a high performance multi-layered wiring structure having a low RC, a wiring layer must be formed of a metal having low resistivity and/or a dielectric layer having low permittivity must be used.

In order to lower the resistance in the metal wiring layer, research is actively being conducted into using a metal having low resistivity, e.g., copper, to form the metal wiring layer. But it is difficult to obtain a copper wiring by directly patterning a copper film using photolithography. Thus, a dual damascene process is usually used to form the copper wiring.

Also, in order to reduce the capacitance generated between the metal wiring layers, a technique of using a low dielectric film as an interlayer dielectric film between the metal wirings has been developed.

In the prior art, however, even if the low dielectric film is used as the interlayer dielectric film, a film formed of a material having relatively high permittivity such as a silicon nitride or a silicon oxynitride is used as a mask layer for patterning the interlayer dielectric film during the dual damascene process. As a result, the high permittivity mask layer remains between the interlayer dielectric film even after the device is completed, thus increasing the mean permittivity of the interlayer dielectric film. Consequently, the advantage of using the low dielectric film as the interlayer dielectric film is reduced.

SUMMARY OF THE INVENTION

To solve the above problems, it is an objective of the present invention to provide a method of forming a metal wiring using a dual damascene process, by which capacitance generated between multi-layered metal wirings in a semiconductor device can be minimized.

Accordingly, a first interlayer dielectric film is formed on a semiconductor substrate on which a conductive layer is formed. A photosensitive polymer pattern having a first hole that has a first width and exposes the upper surface of the first interlayer dielectric film is formed on the first interlayer dielectric film. A second interlayer dielectric film is formed on the photosensitive polymer pattern and the exposed first interlayer dielectric film. A mask pattern having a second hole which is located directly above the first hole, has a second width larger than the first width, and exposes the second interlayer dielectric film, is formed on the second interlayer dielectric film. A wiring region is formed by dry-etching the second interlayer dielectric film using the mask pattern as an etch mask. A via hole region is formed by dry-etching the first interlayer dielectric film using the photosensitive polymer pattern as an etch mask.

The first and second interlayer dielectric films are each formed of a material selected from the group consisting of hydrogen silsesquioxane (HSQ), $SiO_2$, SiCO, amorphous carbon, amorphous CF, porous silica, parylene, and combination thereof.

The step of forming the photosensitive polymer pattern comprises the sub-steps of forming a photosensitive polymer film on the first interlayer dielectric film, and forming the photosensitive polymer pattern by exposing and developing a predetermined portion of the photosensitive polymer film.

The photosensitive polymer film is made of a material selected from the group consisting of polyolefin, polyacetal, polycarbonate, polypropylene and polyimide.

The mask pattern is formed of a photoresist or photosensitive polymer.

The step of forming the wiring region and the step of forming the via hole region can be consecutively performed as a single etching step.

After the step of forming the via hole region, the following steps can be further comprised: the step of removing the mask pattern, and the step of forming a wiring layer within the wiring region and simultaneously forming a via contact within the first hole and the via hole region for electrically connecting the semiconductor substrate to the wiring layer, by depositing a conductive material to fill the via hole region and the wiring region.

The conductive material is a material selected from the group consisting of aluminum, tungsten, copper and alloys thereof.

The step of forming a barrier layer on the second interlayer dielectric film, and on the photosensitive polymer pattern and the first interlayer dielectric film where they are exposed by the wiring region and the via hole region can be further comprised before the conducive material is deposited. Here, the conductive material is deposited on the barrier layer. The barrier layer is formed of a material selected from the group consisting of Ta, TaN and TiN.

The step of planarizing the upper surface of the wiring layer by chemical mechanical polishing (CMP) can be further comprised after the step of forming the via contact. Here, the barrier layer on the second interlayer dielectric film is removed by the CMP.

According to another embodiment of the present invention, a first interlayer dielectric film is formed on a semiconductor substrate on which a conductive layer is formed. An etch stop layer is formed on the first interlayer dielectric film. A second interlayer dielectric film is formed on the etch stop layer. A photosensitive polymer pattern having a first hole which has a first width and exposes the second interlayer dielectric film is formed on the second interlayer dielectric film. A photoresist pattern having a second hole which has a second width smaller than the first width and exposes the second interlayer dielectric film is formed on the upper surface of the second interlayer dielectric film exposed through the photosensitive polymer pattern and the first hole. A third hole, defining a second interlayer dielectric film pattern and an etch stop layer pattern, which expose a region of the first interlayer dielectric film through the second hole and the third hole having the same width as the second hole, are formed by sequentially dry-etching the exposed second interlayer dielectric film and the etch stop layer using the photoresist pattern as an etch mask. The photoresist pattern is removed. A wiring region and a via hole region are simultaneously formed by dry-etching the first and second interlayer dielectric films using the photosensitive polymer pattern and the etch stop layer pattern as an etch mask.

The first and second interlayer dielectric films are each formed of a material selected from the group consisting of hydrogen silsesquioxane (HSQ), $SiO_2$, SiCO, amorphous carbon, amorphous CF, porous silica, parylene, and combination thereof.

The etch stop layer is formed of SiC or photosensitive polymer.

The step of forming the photosensitive polymer pattern comprises the substeps of: forming a photosensitive polymer film on the second interlayer dielectric film; and forming the photosensitive polymer pattern by exposing and developing a predetermined portion of the photosensitive polymer film.

The photosensitive polymer film is made of a material selected from the group consisting of polyolefin, polyacetal, polycarbonate, polypropylene and polyimide.

The step of forming a wiring layer within the wiring region and simultaneously forming a via contact within the third hole formed in the etch stop layer pattern and within the via hole region for electrically connecting the semiconductor substrate to the wiring layer by depositing a conductive material to fill the via hole region and the wiring region can be further comprised after the step of simultaneously forming the wiring region and the via hole region. The conductive material is selected from the group consisting of aluminum, tungsten, copper and alloys thereof.

The step of forming a barrier layer on the photosensitive polymer pattern, and on the second interlayer dielectric film, the etch stop layer pattern, the first interlayer dielectric film, where they are exposed by the wiring region and the via hole region, can be further comprised before the conducive material is deposited. Here, the conductive material is deposited on the barrier layer. The barrier layer is formed of a material selected from the group consisting of Ta, TaN and TiN.

The step of planarizing the upper surface of the wiring layer by chemical mechanical polishing (CMP) can be further comprised after the step of forming the via contact. Here, the barrier layer on the photosensitive polymer pattern is removed by the CMP.

According to the present invention, the capacitance generated between multi-layered metal wiring layers is remarkably reduced, so that RC delay can be minimized in the multi-layered metal wiring system, and the number of process steps required to form a metal wiring using a dual damascene process can be reduced.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENTS

Figure 1A:
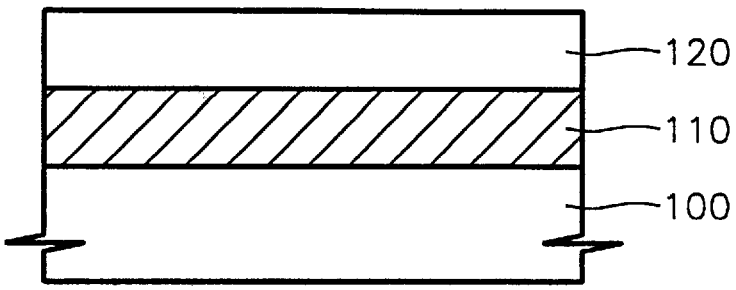
FIGS. 1A through 1H are cross-sectional views illustrating a method of forming a metal wiring using a dual damascene process, according to a first embodiment of the present invention.

Referring to FIG. 1A, a first interlayer dielectric film 120 comprised of a low dielectric constant material is formed on a semiconductor substrate 100 on which a conductive layer 110 is formed. Here, the conductive layer 110 may be an impurities-doped region formed on the semiconductor substrate 100 or a wiring layer.

The first interlayer dielectric film 120 is comprised of a polymer having low permittivity such as hydrogen silsesquioxane (HSQ), $SiO_2$, SiCO, amorphous carbon, amorphous CF, porous silica, or parylene, and can be formed by chemical vapor deposition (CVD) or spin coating.

Figure 1B:
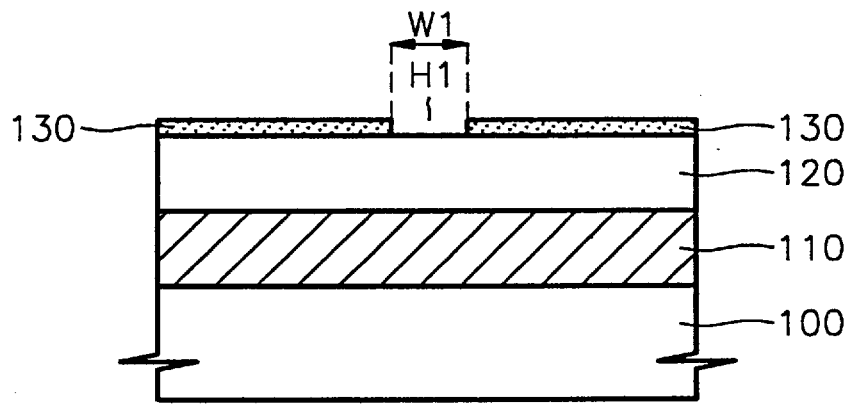

Referring to FIG. 1B, a photosensitive polymer pattern 130 having a first hole H1 is formed on the first interlayer dielectric film 120. The first hole H1 has a first width W1 and exposes a region of the upper surface of the first interlayer dielectric film 120.

In order to form the photosensitive polymer pattern 130, first, a photosensitive polymer film is formed on the first interlayer dielectric film 120. Then, a region of the photosensitive polymer film is exposed and developed, thereby forming the photosensitive polymer pattern 130.

The photosensitive polymer film is formed of a photosensitive polymer having lower permittivity than a silicon oxide or a silicon nitride. Aliphatic polymer or aromatic polymer can be used as the photosensitive polymer. Preferably, the photosensitive polymer is one selected from the group consisting of polyolefin, polyacetal, polycarbonate, polypropylene, and polyimide.

Figure 1C:
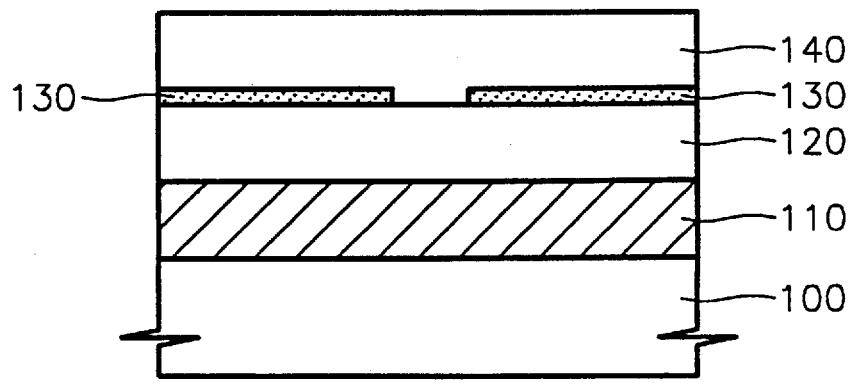

Referring to FIG. 1C, a second interlayer dielectric film 140 comprised of a low dielectric constant material is formed on the upper surface of the photosensitive polymer pattern 130 and the exposed upper surface of the first interlayer dielectric film 120.

The second interlayer dielectric film 140 is comprised of photosensitive polymer having low permittivity such as HSQ, $SiO_2$, SiCO, amorphous carbon, amorphous CF, porous silica, or parylene, and can be formed by CVD or spin coating. The second interlayer dielectric film 140 can be formed of the same material as that of the first interlayer dielectric film 120 or a different material.

Figure 1D:
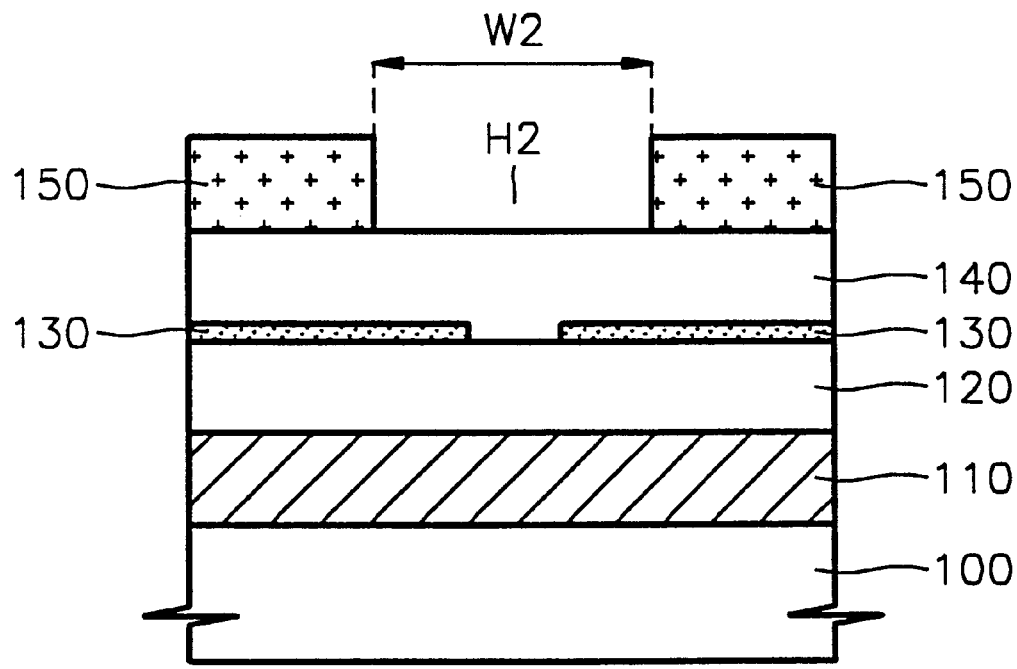

Referring to FIG. 1D, a mask pattern 150 having a second hole H2 is formed on the second interlayer dielectric film 140. The second hole H2 has a second width W2 larger than the first width W1 and exposes a region of the second interlayer dielectric film 140. Here, the second hole H2 is formed over the first hole H1, such that the first hole H1 is exposed upon etching the second interlayer dielectric film 140.

In its preferred embodiment, the mask pattern 150 is formed of photoresist. The mask pattern 150 can be formed of the aforementioned photosensitive polymer having low permittivity.

Figure 1E:
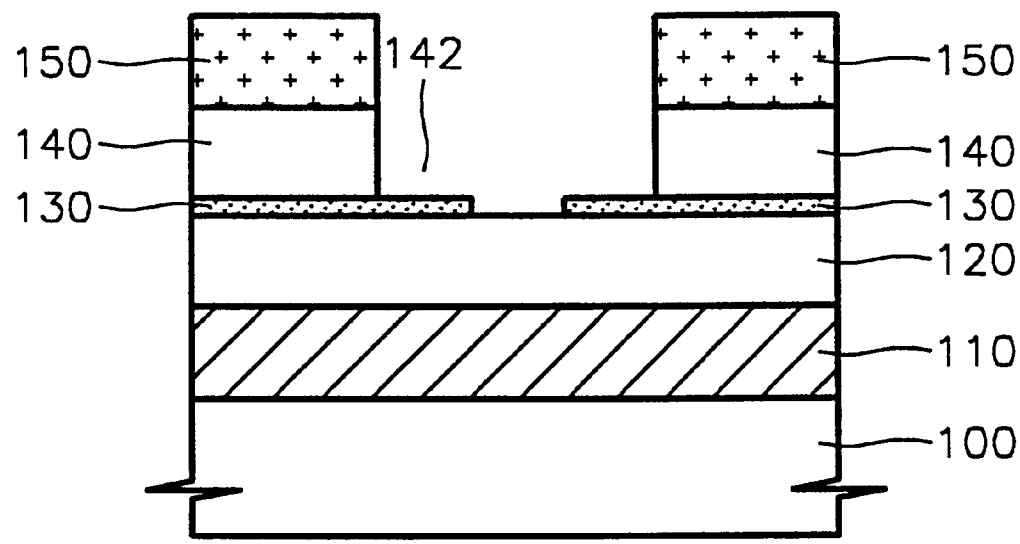

Referring to FIG. 1E, the second interlayer dielectric film 140 is dry etched using the mask pattern 150 as an etch mask, thereby forming a wiring region 142. The second interlayer dielectric film 140 can be etched by reactive ion etching (RIE) or sputtering.

When the wiring region 142 is formed, the first hole H1 of the photosensitive polymer pattern 130 and the periphery of the first hole H1 are exposed by the wiring region 142, and thus a region of the first interlayer dielectric film 120 is exposed through the first hole H1 of the photosensitive polymer pattern 130.

Figure 1F:
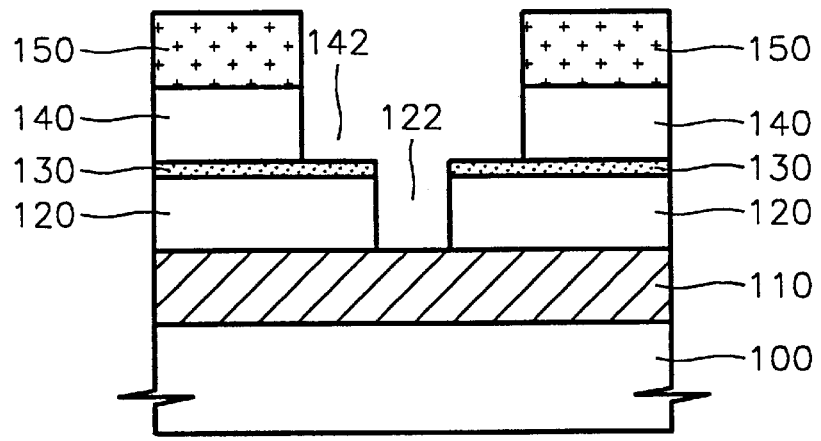

Referring to FIG. 1F, the first interlayer dielectric film 120 is dry-etched using the photosensitive polymer pattern 130 as an etch mask, thereby forming a via hole region 122 exposing a region of the conductive layer 110.

The first interlayer dielectric film 120 is etched by the same method as the method of etching the second interlayer dielectric film 140. The etch process of the first interlayer dielectric film 120 can be combined in a single etch step with the etch process of the second interlayer dielectric film 140.

Figure 1G:
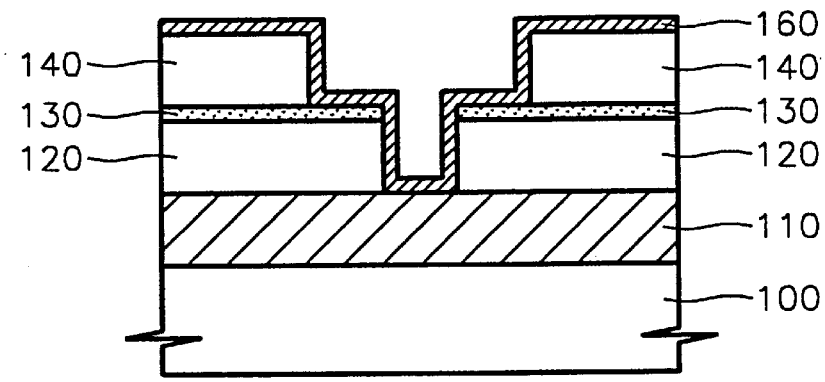

Referring to FIG. 1G, after the mask pattern 150 is removed, a barrier layer 160 is formed on the resultant structure on which the wiring region 142 and the via hole region 122 are formed. That is, the barrier layer 160 is formed on the surfaces of the second interlayer dielectric film 140, and on the photosensitive polymer pattern 130 and the first interlayer dielectric film 120 where they are exposed by the wiring region 142 and the via hole region 122. The barrier layer 160 is formed of a material selected from the group consisting of Ta, TaN, and TiN.

Figure 1H:
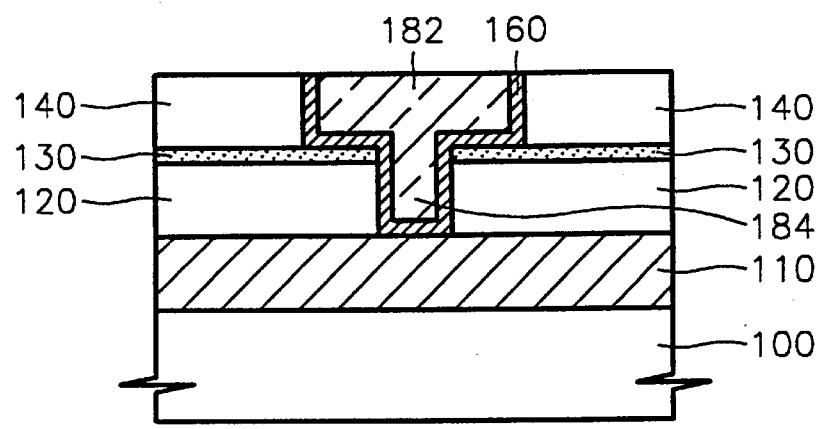

Referring to FIG. 1H, a material selected from the group consisting of aluminum, tungsten, copper and alloys thereof is deposited as a conductive material to fill the via hole region 122 and the wiring region 142.

Thereafter, the resultant structure on which the conductive material is deposited is planarized by chemical mechanical polishing (CMP). Thus, the second interlayer dielectric film 140 is planarized. Planarization removes the conductive material deposited outside of wiring region 142, thereby completing a wiring layer 182 formed in the wiring region 142. Here, the barrier layer 160 on the second interlayer dielectric film 140 is removed by the CMP. Also, a via contact 184 for electrically connecting the conductive layer 110 on the semiconductor substrate 100 to the wiring layer 182 is formed in the first hole H1 and the via hole region 122.

The first embodiment applies where the dual damascene process is performed to contact conductive layer 110 on semiconductor substrate 100. An alternate embodiment uses the steps outlined above, but provides for a via contact 184 directly contacting semiconductor substrate 100.

The wiring layer 182 can be a bit line or a word line instead of a wiring layer for interconnection between conductive layers. Also, the contact formed through the first interlayer dielectric film 120 can be a contact plug instead of the above-described via contact 184.

FIGS. 2A through 2J are cross-sectional views illustrating a method of forming a metal wiring using a dual damascene process, according to a second embodiment of the present invention.

Figure 2A:
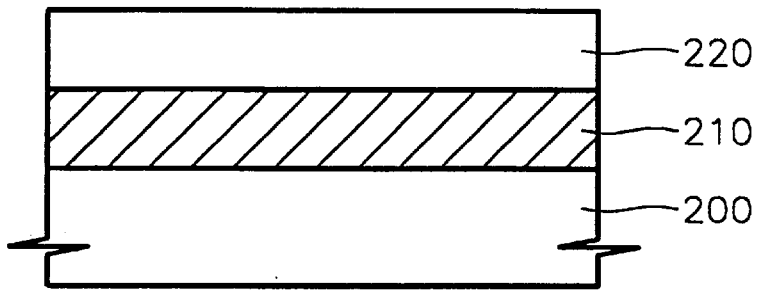
FIGS. 2A through 2J are cross-sectional views illustrating a method of forming a metal wiring using a dual damascene process, according to a second embodiment of the present invention.

Referring to FIG. 2A, a first interlayer dielectric film 220 of a low dielectric constant material is formed on a semiconductor substrate 200 on which a conductive layer 210 is formed. The first interlayer dielectric film 220 is formed of a polymer having low permittivity such as HSQ, $SiO_2$, SiCO, amorphous carbon, amorphous CF, porous silica, or parylene, by chemical vapor deposition (CVD) or spin coating.

Figure 2B:
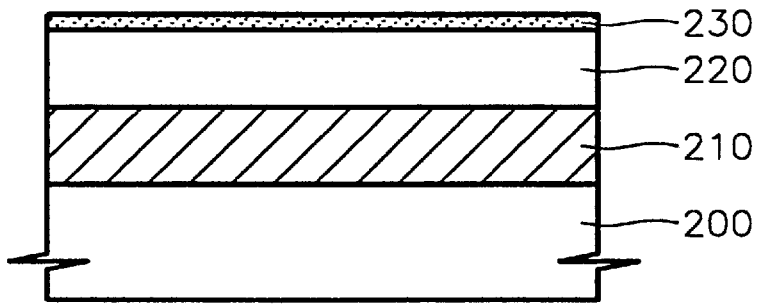

Referring to FIG. 2B, an etch stop layer 230 is formed on the first interlayer dielectric film 220. The etch stop layer 230 is formed of a material different from the first interlayer dielectric film 220 and a second interlayer dielectric film to be formed in the following process, in order to provide etch selectivity with respect to the second interlayer dielectric film. For example, the etch stop layer 230 is formed of SiC or photosensitive polymer. The SiC and photosensitive polymer have lower permittivity than an oxide film. The photosensitive polymer suitable to form the etch stop layer 230 is polyolefin, polyacetal, polycarbonate, polypropylene, or polyimide.

Figure 2C:
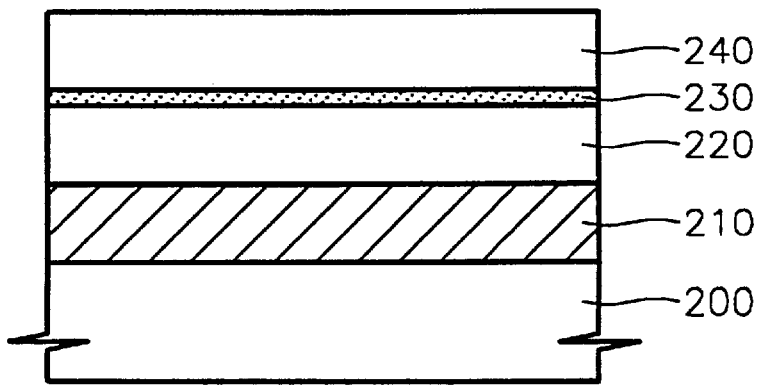

Referring to FIG. 2C, a second interlayer dielectric film 240 is formed on the etch stop layer 230. The second interlayer dielectric film 240 is formed of a polymer having low permittivity such as HSQ, $SiO_2$, SiCO, amorphous carbon, amorphous CF, porous silica or parylene, by CVD or spin coating. The second interlayer dielectric film 240 can be formed of the same material as that of the first interlayer dielectric film 220 or a different material.

Figure 2D:
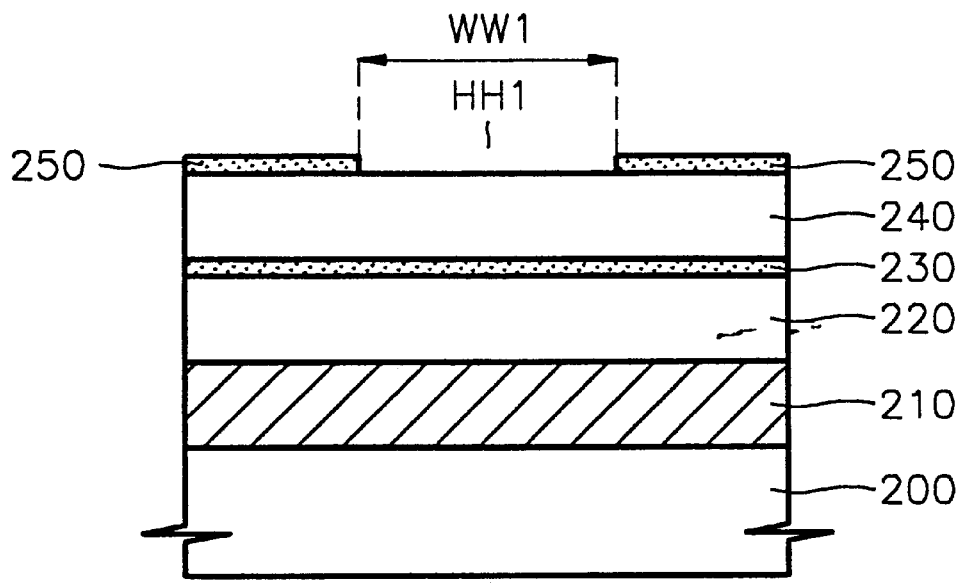

Referring to FIG. 2D, a photosensitive polymer pattern 250 having a first hole HH1 is formed on the second interlayer dielectric film 240. The first hole HH1 has a first width WW1 and exposes a region of the second interlayer dielectric film 240.

In order to form the photosensitive polymer pattern 250, a photosensitive polymer film is formed on the second interlayer dielectric film 240. Then, a region of the photosensitive polymer film is exposed and developed, thereby forming the photosensitive polymer pattern 250.

The photosensitive polymer film is formed of a photosensitive polymer having lower permittivity than a silicon oxide or a silicon nitride. Polyolefin, polyacetal, polycarbonate, polypropylene or polyimide can be used as the photosensitive polymer in the present invention.

Figure 2E:
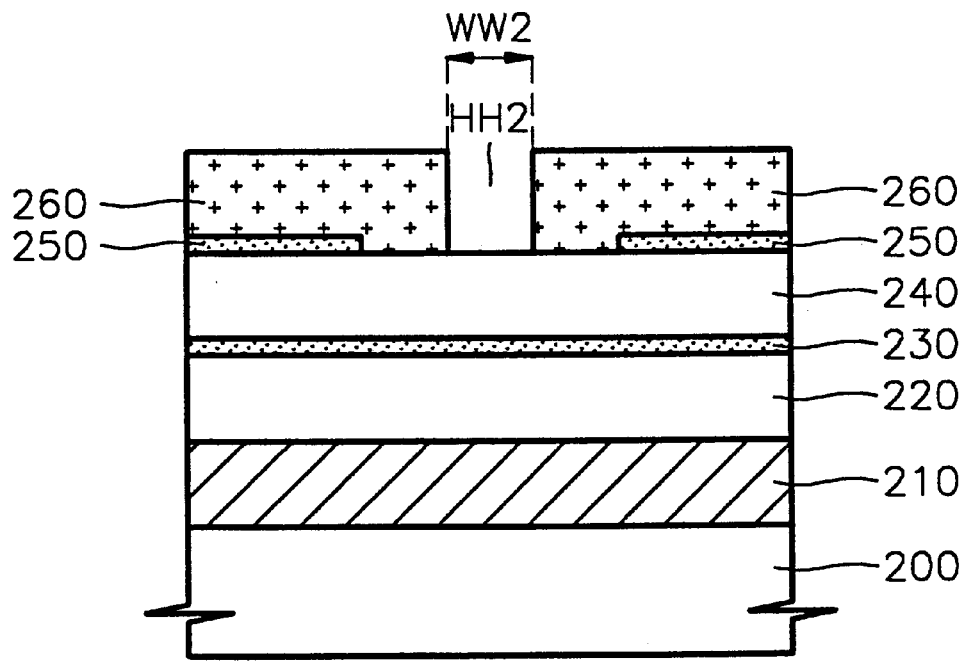

Referring to FIG. 2E, a photoresist pattern 260 having a second hole HH2 is formed on the photosensitive polymer pattern 250 and the second interlayer dielectric film 240 exposed through the first hole HH1. The second hole HH2 has a second width WW2 smaller than the first width WW1 and exposes a portion of the second interlayer dielectric film 240.

Figure 2F:
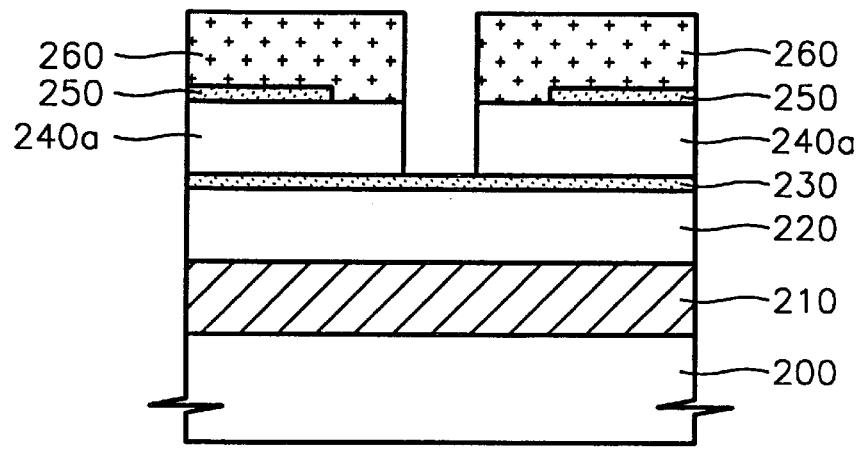
Figure 2G:
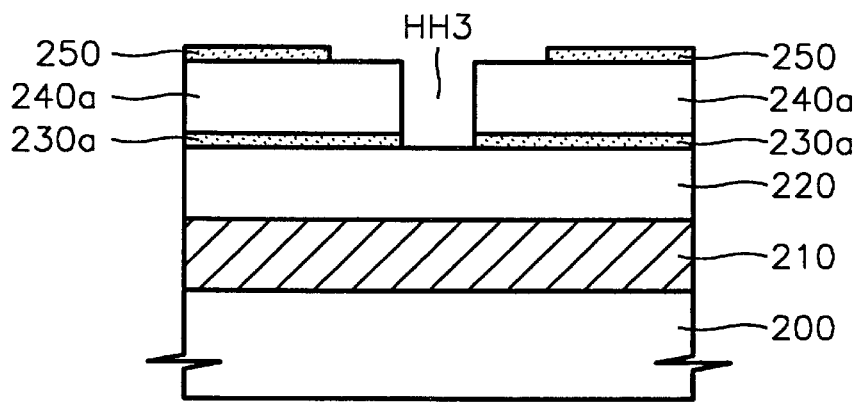

As shown in FIG. 2F, the exposed second interlayer dielectric film 240 is dry-etched using the photoresist pattern 260 as an etch mask. Then, as shown in FIG. 2G, a region of the etch stop layer 230 exposed by etching the second interlayer dielectric film 240 is dry-etched. These two etch steps form a third hole HH3, defining a second interlayer dielectric film pattern 240a and an etch stop layer pattern 230a, and exposing a region of the first interlayer dielectric film 220 through the third hole HH3 having almost the same width as the second hole HH2.

Etching of the second interlayer dielectric film 240 and the etch stop layer 230 can be performed by RIE or sputtering. The respective etching processes can be consecutively performed as a two-step etching process where each step is performed in-situ under different conditions within a single etch chamber.

After the third hole HH3 is formed, the photoresist pattern 260 is removed.

Figure 2H:
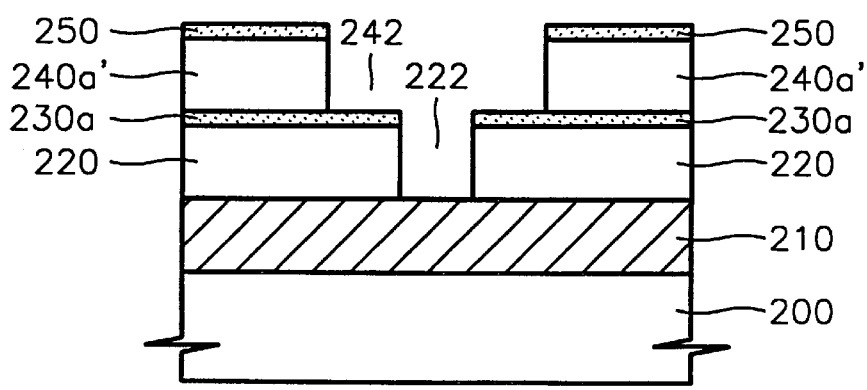

Referring to FIG. 2H, the second interlayer dielectric film pattern 240a' and the first interlayer dielectric film 220 are dry-etched using the photosensitive polymer pattern 250 and the etch stop layer pattern 230a as etch masks, thereby simultaneously forming a wiring region 242 and a via hole region 222. Here, RIE or sputtering can be used for the dry etching step.

Figure 2I:
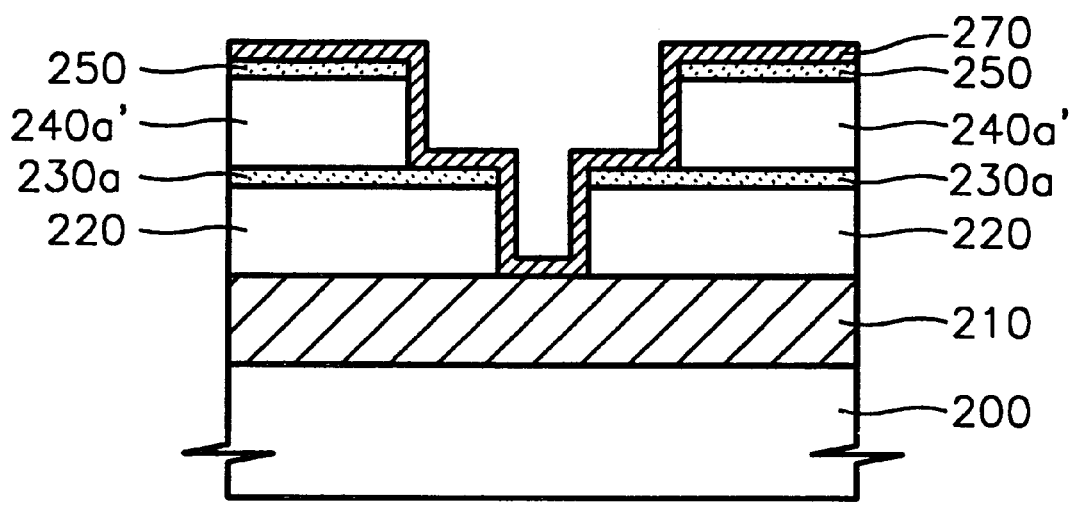

Referring to FIG. 2I, a barrier layer 270 is formed on the resultant structure on which the wiring region 242 and the via hole region 222 are formed. That is, the barrier layer 270 is formed on the photosensitive polymer pattern 250, and on the second interlayer dielectric film pattern 240a', the etch stop layer pattern 230a, and the first interlayer dielectric film 220, where they are exposed by the wiring region 242 and the via hole region 222. The barrier layer 270 is formed of a material selected from the group consisting of Ta, TaN and TiN.

Figure 2J:
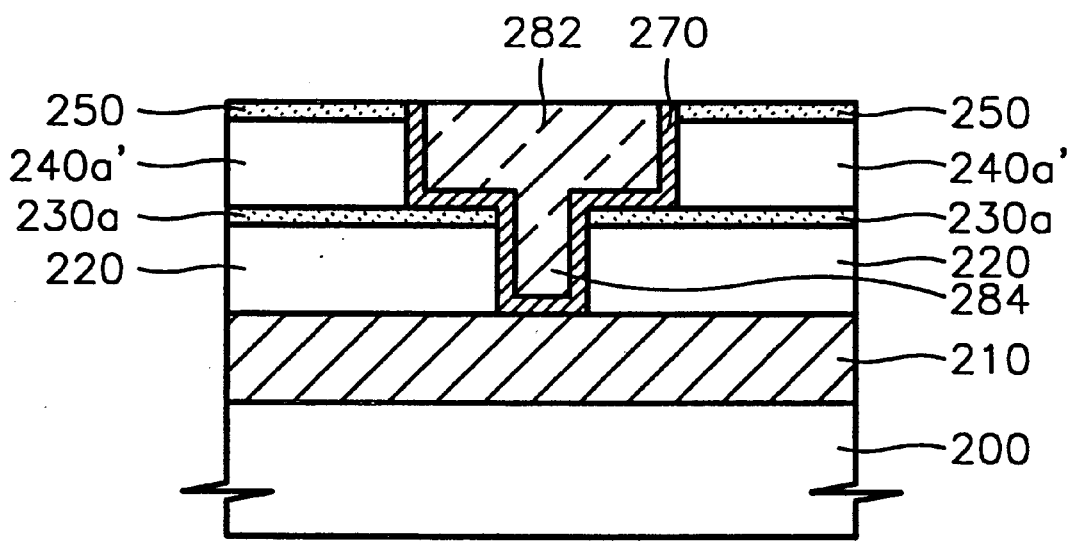

Referring to FIG. 2J, a material selected from the group consisting of aluminum, tungsten, copper and alloys thereof is deposited as a conductive material to fill the via hole region 222 and the wiring region 242.

Then, the resultant structure on which the conductive material is deposited is planarized by CMP. Planarization removes the conductive material deposited outside of wiring region 242, thereby completing a wiring layer 282 within the wiring region 242. Also, a via hole contact 284 for electrically connecting the conductive layer 210 on the semiconductor substrate 200 to the wiring layer 282 is formed within the third hole HH3 formed in the etch stop layer pattern 230a and within the via hole region 222. The CMP process also removes the barrier layer 270 on the photosensitive polymer pattern 250.

The second embodiment applies where the dual damascene process is performed on the conductive layer 210 on the semiconductor substrate 200. However, the method described above can also be applied when the via contact 284 is directly connected to the semiconductor substrate 200.

The wiring layer 282 can be a bit line or a word line instead of a wiring layer for interconnection between conductive layers. Also, the contact formed through the first interlayer dielectric film 220 can constitute a contact plug instead of the via contact 284 described above.

In a conventional method of forming a metal wiring using the dual damascene process, a relatively-high dielectric constant material such as a silicon nitride having a permittivity of about 7.5 is usually used as an etch mask to pattern an interlayer dielectric film. However, in the present invention, a photosensitive polymer having a low permittivity of 3.0 or less is used as the etch mask to pattern the interlayer dielectric film, thus effectively reducing the total capacitance of the interlayer dielectric film compared to the prior art.

In the preferred embodiments as described above, when a multi-layered metal wiring is formed by the dual damascene process, a mask pattern to be used to pattern the interlayer dielectric film is formed of a photosensitive polymer having low permittivity, thus remarkably reducing capacitance generated between multi-layered metal wiring layer.

Also, the conventional method using a silicon nitride film as an etch mask requires additional steps to form the etch mask pattern. However, in the present invention, the mask pattern used to pattern the interlayer dielectric film is formed of a photosensitive polymer, so that the number of process steps required to form the mask pattern is reduced. Therefore, the total number of process steps required to form the metal wirings using the dual damascene process is reduced.

As described above, the present invention was described in detail with the preferred embodiments, but it is not limited to these embodiments. Various modification may be effected within the technical spirit of the present invention by those skilled in the art.

What is claimed is:

1. A method of forming a metal wiring, comprising the steps of:
   (a) forming a first interlayer dielectric film on a semiconductor substrate;
   (b) forming a photosensitive polymer pattern film on the first interlayer dielectric film, the photosensitive polymer pattern having a first hole with a first width, the first hole exposing a region of the upper surface of the first interlayer dielectric film;
   (c) forming a second interlayer dielectric film on the photosensitive polymer pattern and the exposed region of the first interlayer dielectric film;
   (d) forming a mask pattern on the second interlayer dielectric film, the mask pattern having a second hole, with a second width larger than the first width, above the first hole, said second hole exposing a region of the upper surface of the second interlayer dielectric film;
   (e) dry-etching the second interlayer dielectric film using the mask pattern as an etch mask, thereby forming a wiring region; and
   (f) dry-etching through the first interlayer dielectric film using the photosensitive polymer pattern as an etch mask, thereby forming a via hole region aligned with the first hole.

2. The method of forming a metal wiring as claimed in claim 1, wherein the first and second interlayer dielectric films are each formed of a material selected from the group consisting of hydrogen silsesquioxane (HSQ), $SiO_2$, SiCO, amorphous carbon, amorphous CF, porous silica, parylene, and combination thereof.

3. The method of forming a metal wiring as claimed in claim 1, wherein the step (b) comprises the substeps of:
   (b-1) forming a photosensitive polymer film on the first interlayer dielectric film; and
   (b-2) forming the photosensitive polymer pattern by exposing and developing a predetermined region of the photosensitive polymer film.

4. The method of forming a metal wiring as claimed in claim 3, wherein the photosensitive polymer film is made of a material selected from the group consisting of polyolefin, polyacetal, polycarbonate, polypropylene and polyimide.

5. The method of forming a metal wiring as claimed in claim 1, wherein the mask pattern in the step (b) is formed of a photoresist or photosensitive polymer.

6. The method of forming a metal wiring as claimed in claim 1, wherein the steps (e) and (f) are consecutively performed as a single etching step.

7. The method of forming a metal wiring as claimed in claim 1, after the step (f), further comprising the steps of:
   (g) removing the mask pattern; and
   (h) forming a conductive layer by depositing a conductive material to fill the via hole region and the wiring region.

8. The method of forming a metal wiring as claimed in claim 7, wherein the conductive material in the step (h) is a material selected from the group consisting of aluminum, tungsten, copper and alloys thereof.

9. The method of forming a metal wiring as claimed in claim 7, further comprising, before the conducive material is deposited in the step (h), the step of forming a barrier layer on the second interlayer dielectric film, and on the photosensitive polymer pattern and the first interlayer dielectric film where they are exposed by the wiring region and the via hole region.

10. The method of forming a metal wiring as claimed in claim 9, wherein the barrier layer is formed of a material selected from the group consisting of Ta, TaN and TiN.

11. The method of forming a metal wiring as claimed in claim 9, further comprising, after the step (h), the step of planarizing the conductive layer by chemical mechanical polishing (CMP), wherein the barrier layer is removed by the CMP where the layer overlies the second interlayer dielectric film.

12. The method of forming a metal wiring as claimed in claim 9, further comprising, after the step (h), the step of forming a wiring layer within the wiring region by patterning the conductive layer by using a photoresist pattern.

* * * * *